(12) United States Patent
Nishi et al.

(10) Patent No.: US 8,836,103 B2
(45) Date of Patent: Sep. 16, 2014

(54) SEMICONDUCTOR UNIT

(71) Applicant: Kabushiki Kaisha Toyota Jidoshokki, Aichi-ken (JP)

(72) Inventors: Shinsuke Nishi, Aichi-ken (JP); Shogo Mori, Aichi-ken (JP); Yuri Otobe, Aichi-ken (JP); Naoki Kato, Aichi-ken (JP)

(73) Assignee: Kabushiki Kaisha Toyota Jidoshokki, Aichi (JP)

( * ) Notice: Subject to any disclaimer, the term of this patent is extended or adjusted under 35 U.S.C. 154(b) by 0 days.

(21) Appl. No.: 13/954,464

(22) Filed: Jul. 30, 2013

(65) Prior Publication Data
US 2014/0035120 A1 Feb. 6, 2014

(30) Foreign Application Priority Data
Aug. 3, 2012 (JP) .................................. 2012-173023

(51) Int. Cl.
*H01L 23/52* (2006.01)

(52) U.S. Cl.
USPC .......................................... 257/691; 257/712

(58) Field of Classification Search
USPC ......... 257/678, 691, 692, 693, 694, 695, 696, 257/697, 712
See application file for complete search history.

(56) References Cited

U.S. PATENT DOCUMENTS
2007/0076355 A1 4/2007 Oohama

FOREIGN PATENT DOCUMENTS
JP 2006-202885 A 8/2006
JP 2009-146933 A 7/2009

*Primary Examiner* — Jae Lee
*Assistant Examiner* — Quovaunda V Jefferson
(74) *Attorney, Agent, or Firm* — Sughrue Mion, PLLC

(57) ABSTRACT

A semiconductor unit includes an insulation layer, a conductive layer bonded to one side of the insulation layer, a semiconductor device mounted on the conductive layer, a cooler thermally coupled to the other side of the insulation layer, a first bus bar having a bonding surface bonded to the semiconductor device or the conductive layer and a non-bonding surface that is the part of the first bus bar other than the bonding surface, and a second bus bar having a bonding surface bonded to the semiconductor device or the conductive layer and a non-bonding surface that is the part of the second bus bar other than the bonding surface. The second bus bar has a greater ratio of the area of the bonding surface to the area of the non-bonding surface than the first bus bar. The second bus bar has a lower electric resistance than the first bus bar.

6 Claims, 5 Drawing Sheets

US 8,836,103 B2

SEMICONDUCTOR UNIT

BACKGROUND OF THE INVENTION

The present invention relates to a semiconductor unit having a semiconductor device provided on a conductive layer formed over an insulation layer.

Japanese Unexamined Patent Application Publication No. 2006-202885 discloses a semiconductor unit which can be used for example as an electric power converter. The semiconductor unit has an IGBT (insulated gate bipolar transistor) as a semiconductor device and a diode. The collector of the IGBT and the bottom electrode of the diode are soldered to a block serving to release the heat generated by the IGBT and the diode and also to connect between the IGBT and the diode. The emitter of the IGBT and the top electrode of the diode are connected by a lead.

While the semiconductor unit is being energized, electric current flows through the block and the lead, so that the block and the lead are heated. In this case, the lead is less cooled by radiation than the block that is intended to function as a radiator, which leads to the difference in the cooling between the block and the lead, that is, between the two different conductive members through which electric current flows.

The present invention is directed to providing a semiconductor unit of a structure that allows reduction of the difference in the cooling between different conductive members through which current flows.

SUMMARY OF THE INVENTION

In accordance with an aspect of the present invention, a semiconductor unit includes an insulation layer, a conductive layer bonded to one side of the insulation layer, a semiconductor device mounted on the conductive layer, a cooler thermally coupled to the other side of the insulation layer, a first bus bar having a bonding surface bonded to the semiconductor device or the conductive layer and a non-bonding surface that is the part of the first bus bar other than the bonding surface, and a second bus bar having a bonding surface bonded to the semiconductor device or the conductive layer and a non-bonding surface that is the part of the second bus bar other than the bonding surface. The second bus bar has a greater ratio of the area of the bonding surface to the area of the non-bonding surface than the first bus bar. The second bus bar has a lower electric resistance than the first bus bar.

In accordance with another aspect of the present invention, a semiconductor unit includes an insulation layer, a conductive layer bonded to one side of the insulation layer, a semiconductor device mounted on the conductive layer, a cooler thermally coupled to the other side of the insulation layer, a first bus bar having a bonding surface bonded to the semiconductor device or the conductive layer and a non-bonding surface that is the part of the first bus bar other than the bonding surface, and a second bus bar having a bonding surface bonded to the semiconductor device or the conductive layer and a non-bonding surface that is the part of the second bus bar other than the bonding surface. The second bus bar has a greater area of the non-bonding surface than the first bus bar. The second bus bar has a lower electric resistance than the first bus bar.

Other aspects and advantages of the invention will become apparent from the following description, taken in conjunction with the accompanying drawings, illustrating by way of example the principles of the invention.

DETAILED DESCRIPTION OF THE EMBODIMENTS

Figure 1:
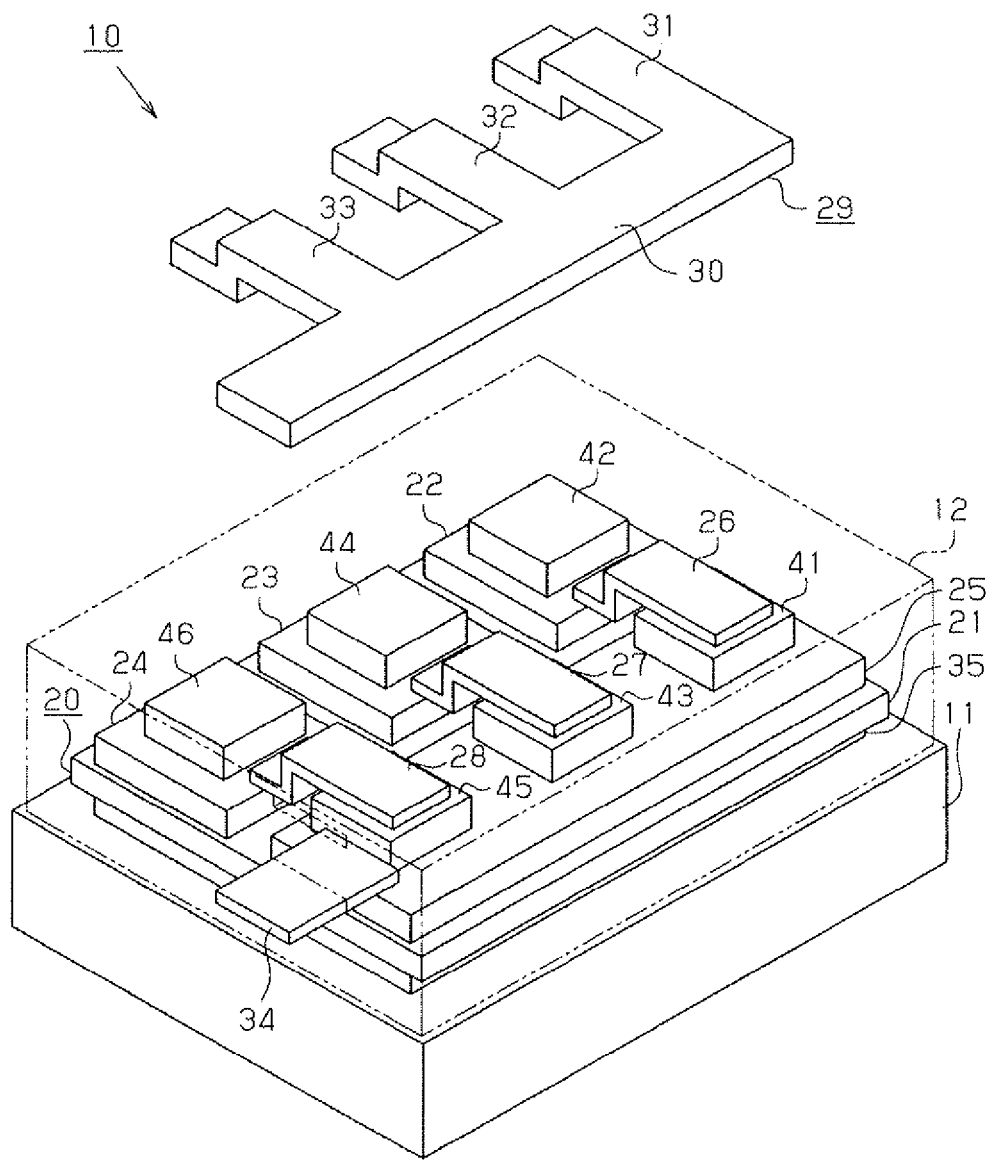
FIG. 1 is an exploded perspective view of a three-phase inverter as an embodiment of a semiconductor unit according to the present invention.

The following will describe the three-phase inverter as one embodiment of the semiconductor unit according to the present invention with reference to FIGS. 1 through 6. Referring to FIG. 1, the three-phase inverter which is designated generally by 10 includes a circuit board 20, six semiconductor devices 41, 42, 43, 44, 45 and 46 mounted on one side of the circuit board 20, and a cooler 11 thermally coupled to the other side of the circuit board 20. It is noted that the upper and lower sides as viewed in FIG. 1 correspond to the upper and lower sides of the inverter 10, respectively.

The circuit board 20 includes a rectangular ceramic substrate 21 or insulation layer and first, second, third and fourth metal plates 22, 23, 24 and 25 each bonded to the top surface of the ceramic substrate 21. The metal plates 22 to 25 are each made of a conductive material such as aluminum. The metal plates 22 to 25 correspond to the conductive layer of the present invention.

The first, second and third metal plates 22, 23 and 24 are arranged in longitudinal direction of the ceramic substrate 21. The fourth metal plate 25 and each of the first, second and third metal plates 22, 23 and 24 are arranged in transverse direction of the ceramic substrate 21.

Of the six semiconductor devices 41 to 46, three semiconductor devices 42, 44, 46 are mounted on top surfaces of the first, second and third metal plates 22, 23, 24, respectively, and the rest of three semiconductor devices 41, 43, 45 are mounted on the top surface of the fourth metal plate 25.

Figure 6:
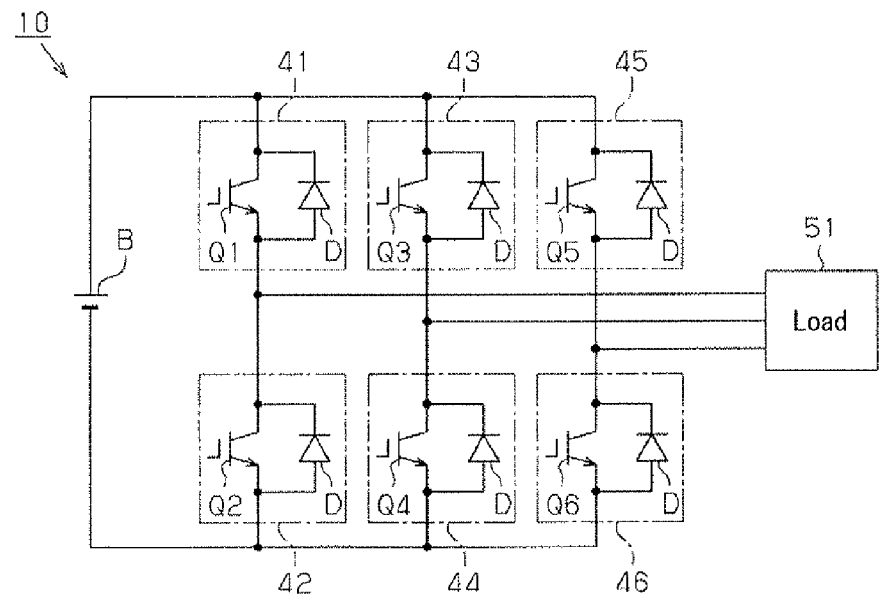
FIG. 6 is an electric circuit diagram of the inverter of FIG. 1.

Referring to FIG. 6 showing the electric circuit diagram of the inverter 10 of the present embodiment, each of the semiconductor devices 41, 42, 43, 44, 45, 46 has one device incorporating one switching device such as Q1, Q2, Q3, Q4, Q5, Q6 and one diode D. The switching devices Q1 to Q6 may be provided by a power semiconductor device such as an IGBT (insulated gate bipolar transistor) or power MOSFET (metal oxide semiconductor field effect transistor). The gates and emitters of the respective switching devices Q1 to Q6 are provided on the top surfaces of the respective semiconductor devices 41 to 46, and the collectors of the respective switching devices Q1 to Q6 are provided on the bottom surfaces of the respective semiconductor devices 41 to 46. The anodes of the respective diodes D are provided on the top surfaces of the respective semiconductor devices 41 to 46, and the cathodes of the respective diodes D are provided on the bottom surfaces of the respective semiconductor devices 41 to 46.

Figure 2:
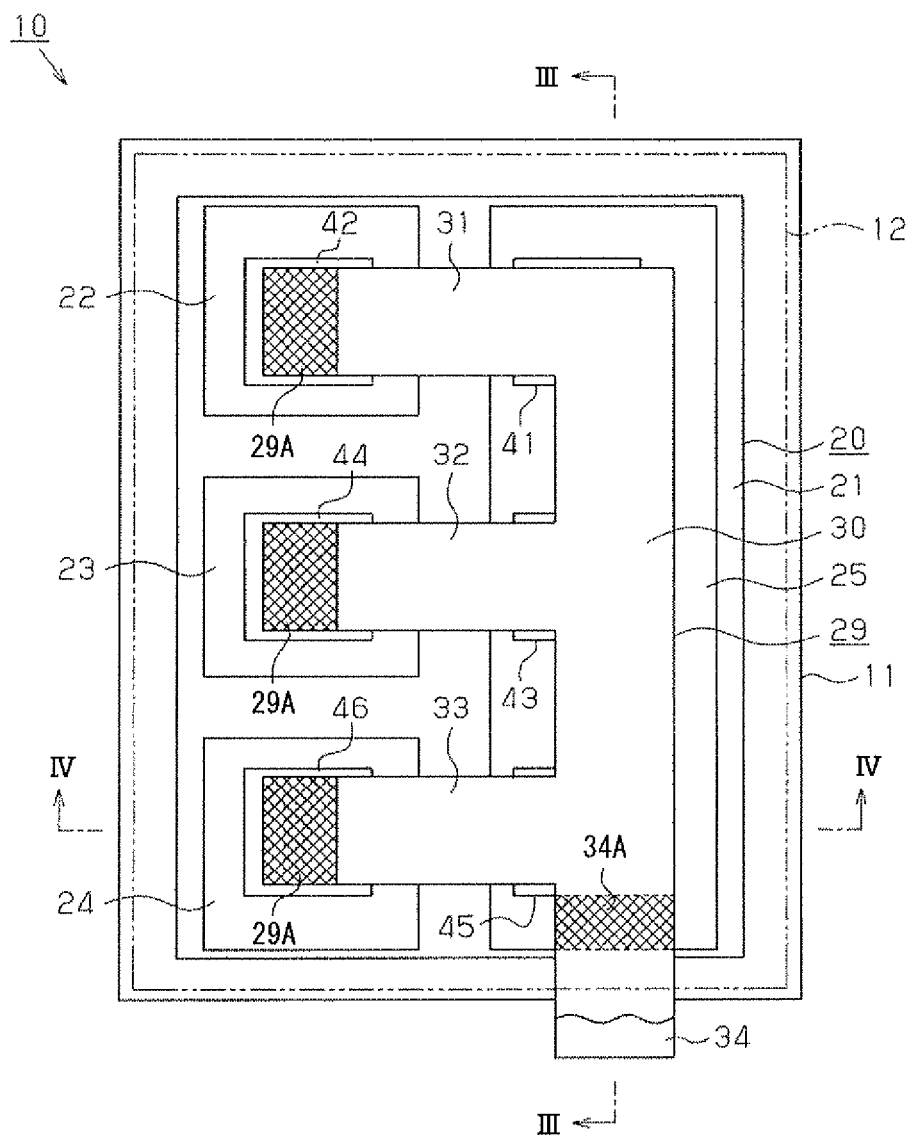
FIG. 2 is a plan view of the inverter of FIG. 1.

As shown in FIGS. 1 and 2, the inverter 10 includes connecting members 26, 27, 28 having a rectangular profile in plan view and bonded to the respective metal plates 22, 23, 24. The connecting member 26 is bonded at one longitudinal end thereof to the top surface of the first metal plate 22 and at the opposite longitudinal end thereof to the gate, emitter and anode on the top surface of the semiconductor device 41. The connecting member 27 is bonded at one longitudinal end thereof to the top surface of the second metal plate 23 and at the opposite longitudinal end thereof to the gate, emitter and anode on the top surface of the semiconductor device 43. The connecting member 28 is bonded at one longitudinal end thereof to the top surface of the third metal plate 24 and at the opposite longitudinal end thereof to the gate, emitter and anode on the top surface of the semiconductor device 45. The collector and cathode provided on the bottom surface of the semiconductor device 42 are electrically bonded to the first metal plate 22. The collector and cathode provided on the bottom surface of the semiconductor device 44 are electrically bonded to the second metal plate 23. The collector and cathode provided on the bottom surface of the semiconductor device 46 are electrically bonded to the third metal plate 24. The collectors and cathodes provided on the bottom surfaces of the respective semiconductor devices 41, 43, 45 are electrically bonded to the fourth metal plate 25.

The inverter 10 includes a negative bus bar 29 bonded to the top surfaces of the respective semiconductor devices 42, 44, 46 for electrical connection to a negative terminal of a power source (not shown). The negative bus bar 29 has a base 30 having a rectangular profile in plan view, and connecting portions 31, 32, 33 having a rectangular profile in plan view and extending from the base 30. The connecting portions 31, 32, 33 of the same configuration are spaced from each other longitudinally of the base 30 and extend transversely of the base 30. The connecting portion 31 is bonded to the gate, emitter and anode on the top surface of the semiconductor device 42. The connecting portion 32 is bonded to the gate, emitter and anode on the top surface of the semiconductor device 44. The connecting portion 33 is bonded to the gate, emitter and anode on the top surface of the semiconductor device 46. The negative bus bar 29 electrically connects the semiconductor devices 42, 44, 46 to the negative terminal of the power source.

The collectors of the switching devices Q1, Q3, Q5 on the bottom surfaces of the semiconductor devices 41, 43, 45 are connected through the fourth metal plate 25 and a positive bus bar 34 to a positive terminal of the power source. The emitters of the switching devices Q2, Q4, Q6 on the top surfaces of the semiconductor devices 42, 44, 46 are connected through the negative bus bar 29 to the negative terminal of the power source.

Figure 3:
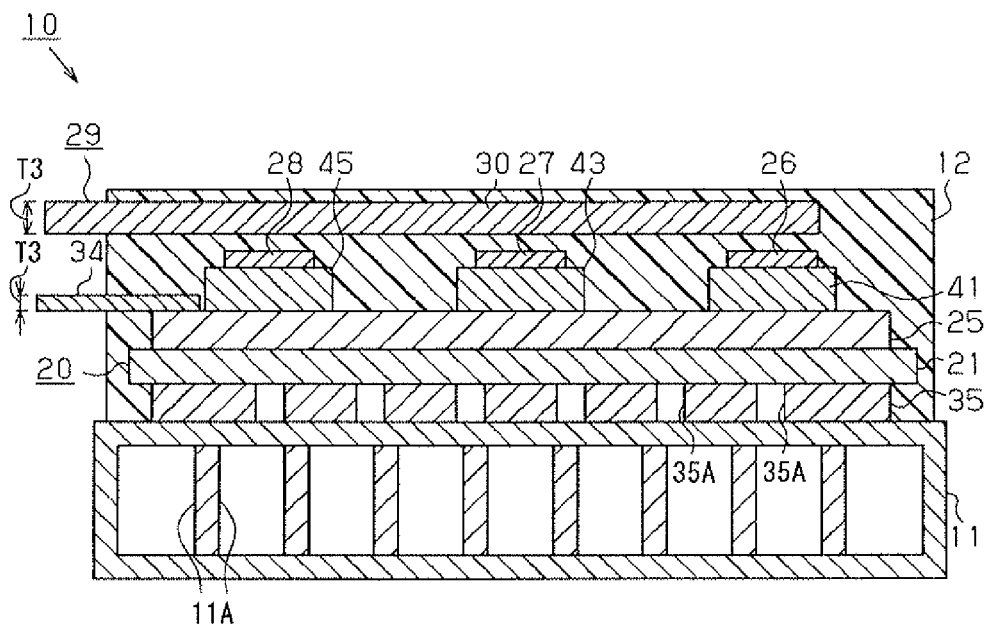
FIG. 3 is a sectional view of the inverter taken along the line III-III of FIG. 2.

As shown in FIGS. 2 and 3, the positive bus bar 34 has a rectangular profile in plan view and is bonded to the top surface of the fourth metal plate 25 for electrical connection to the positive terminal of the power source. The positive bus bar 34 electrically connects the fourth metal plate 25 to the positive terminal of the power source. The positive and negative bus bars 34, 29 are both made of the same conductive material such as copper.

Figure 4:
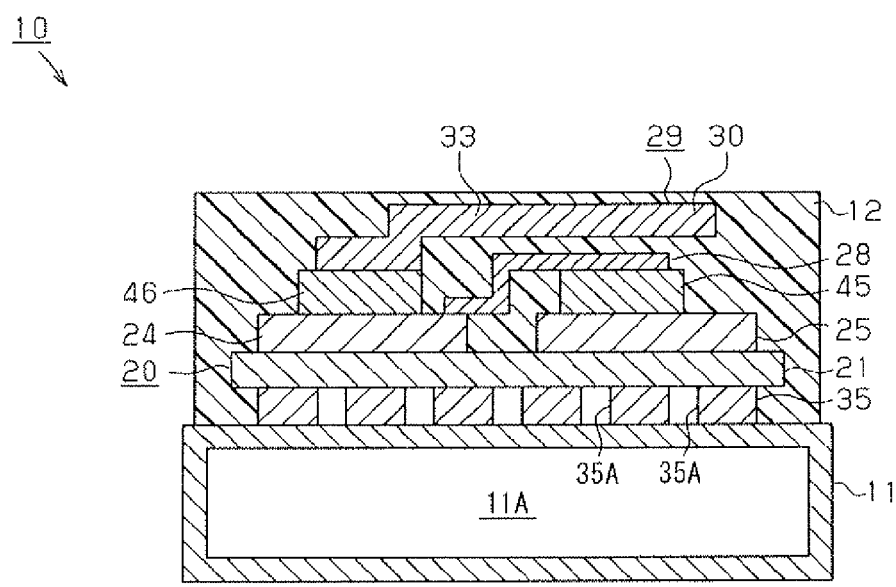
FIG. 4 is a sectional view of the inverter taken along the line IV-IV of FIG. 2.

As shown in FIGS. 3 and 4, the base 30 of the negative bus bar 29 is disposed in overlapping relation to the positive bus bar 34 as seen in the direction of their thickness. The connecting members 26, 27, 28 are disposed in overlapping relation to base 30 and the respective connecting portions 31, 32, 33 of the negative bus bar 29 as seen in the direction of their thickness.

There is provided a stress relief member 35 on the bottom surface of the ceramic substrate 21. The stress relief member 35 is made of a metal plate, such as an aluminum plate, and has plural holes 35A extending therethrough in the direction of its thickness.

The stress relief member 35 is interposed between and bonded to the ceramic substrate 21 and the cooler 11. The cooler 11 has therein plural straight channels 11A through which coolant flows. Although not shown in the drawing, the cooler 11 has an inlet and an outlet through which coolant flows into and out of the channels 11A.

The positive bus bar 34 is thermally coupled to the cooler 11 through the metal plate 25, the ceramic substrate 21 and the stress relief member 35. The negative bus bar 29 is thermally coupled to the cooler 11 through the semiconductor devices 42, 44, 46, the metal plates 22, 23, 24, the ceramic substrate 21 and the stress relief member 35. The positive bus bar 34 and the negative bus bar 29 are cooled by the coolant flowing through the channels 11A of the cooler 11.

Figure 5A:
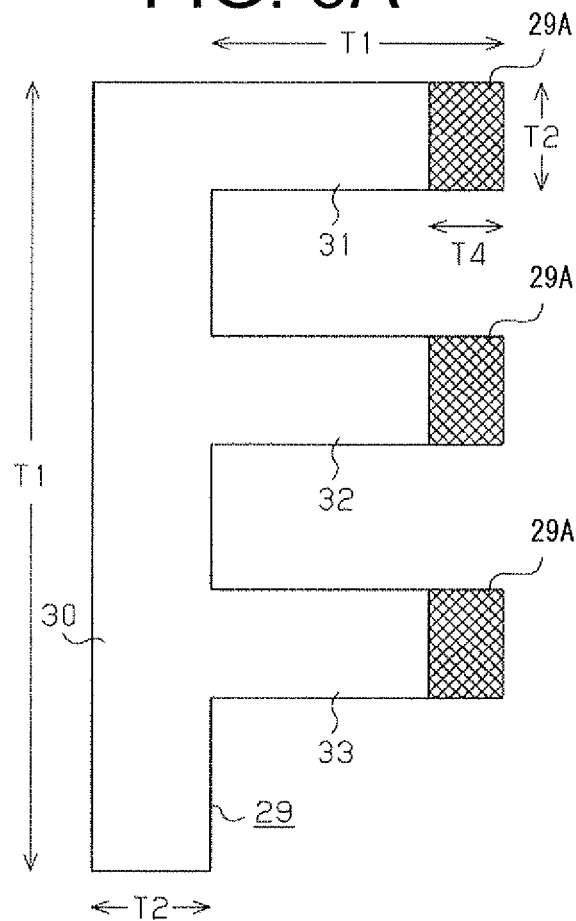
FIG. 5A is a bottom view of a negative bus bar of the inverter of FIG. 1.
Figure 5B:
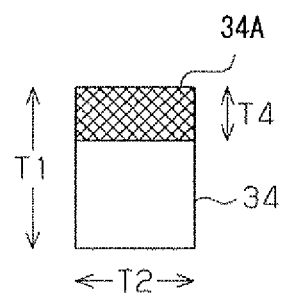
FIG. 5B is a bottom view of a positive bus bar of the inverter of FIG. 1.

FIGS. 5A and 5B are bottom views of the negative and positive bus bars 29, 34, respectively. The parts of the negative bus bar 29 which are bonded to the top surfaces of the respective semiconductor devices 42, 44, 46 (see FIG. 1) are indicated by hatching with reference numeral 29A, and such parts of the negative bus bar 29 will be hereinafter referred to as the bonding surface. Similarly, the part of the positive bus bar 34 which is bonded to the top surface of the metal plate 25 is indicated by hatching with reference numeral 34A, and such part of the positive bus bar 34 will also be hereinafter referred to as the bonding surface. These bonding surfaces 29A, 34A are also shown in FIG. 2. In each of the negative bus bar 29 and the positive bus bar 34, the part other than the bonding surface such as 29A, 34A will be hereinafter referred to as the non-bonding surface.

As shown in FIGS. 5A and 5B, the positive bus bar 34 has substantially the same width T2 as the base 30 and the connecting portions 31, 32, 33 of the negative bus bar 29. The base 30 of the negative bus bar 29 has a greater length T1 than the positive bus bar 34, and the connecting portions 31, 32, 33 of the negative bus bar 29 also have greater length T1 than the positive bus bar 34. As shown in FIG. 3, the negative bus bar 29 has a greater thickness T3 than the positive bus bar 34.

The bonding surface 29A of the negative bus bar 29 has a greater length T4 than the bonding surface 34A of the positive bus bar 34. Since the negative bus bar 29 and the positive bus bar 34 have substantially the same width T2, the bonding surface 29A of the negative bus bar 29 has a greater area than the bonding surface 34A of the positive bus bar 34. The negative bus bar 29 also has a greater area of the non-bonding surface than the positive bus bar 34.

The negative bus bar 29 has a greater ratio of the area of the bonding surface to the area of the non-bonding surface than the positive bus bar 34. In the present embodiment, the positive bus bar 34 corresponds to the first bus bar of the present invention, and the negative bus bar 29 corresponds to the second bus bar of the present invention.

As shown in FIGS. 3 and 4, each of the base 30 and connecting portions 31, 32, 33 of the negative bus bar 29 has a greater cross sectional area of the current path than the positive bus bar 34.

In the three-phase inverter 10 of the present embodiment, the cooler 11 and the components mounted thereon are molded by an insulating mold resin 12. Specifically, the mold resin 12 covers part of the top surface of the cooler 11 and covers the semiconductor devices 41 to 46, the metal plates 22 to 25, the ceramic substrate 21, the stress relief member 35, the connecting members 26 to 28, the negative bus bar 29 and the positive bus bar 34. Part of the positive bus bar 34 and part of the base 30 of the negative bus bar 29 project out of the mold resin 12, to which the power source is electrically connected through, for example, an external electrode.

As shown in FIG. 6, the switching devices Q1, Q3, Q5 in the respective semiconductor devices 41, 43, 45 function as the upper arm of the inverter 10. The switching devices Q2, Q4, Q6 in the respective semiconductor devices 42, 44, 46 function as the lower arm of the inverter 10.

The switching devices Q1, Q2 are connected in series, the switching devices Q3, Q4 are connected in series, and the switching devices Q5, Q6 are connected in series.

The diode D for each of the switching devices Q1 to Q6 is connected in reverse parallel between the emitter and the collector. Specifically, the diode D is connected at its cathode to the emitter and at its anode to the collector.

The connections between the switching devices Q1, Q2, between the switching devices Q3, Q4 and also between the switching devices Q5, Q6 are connected to a load 51 such as a three-phase motor. The inverter 10 converts DC power of a battery B into AC power to be supplied to the load 51.

The following will describe the operation of the above inverter 10 of the present embodiment. While the inverter 10 is being supplied with electric power from the battery B in order to drive the load 51, the conductive members through which electric current flows, such as the positive bus bar 34 and the negative bus bar 29, are heated. The heat generated at the positive bus bar 34 is transferred through the metal plate 25, the ceramic substrate 21 and the stress relief member 35 to the cooler 11. The heat generated at the negative bus bar 29 is transferred through the semiconductor devices 42, 44, 46, the metal plates 22, 23, 24, the ceramic substrate 21 and the stress relief member 35 to the cooler 11.

Of the positive and negative bus bars 34, 29, the negative bus bar 29 whose bonding surface 29A bonded to the semiconductor devices 42, 44, 46 has a relatively large area is more cooled by the cooler 11 than the positive bus bar 34 whose bonding surface 34A bonded to the metal plate 25 has a relatively small area. In other words, the negative bus bar 29 whose the non-bonding surface has a relatively large area is less cooled than the positive bus bar 34 whose non-bonding surface has a relatively small area. Thus, the negative bus bar 29 having a relatively large ratio of the area of the bonding surface 29A to the area of the non-bonding surface is less cooled by the cooler 11 than the positive bus bar 34 having a relatively small ratio of the area of the bonding surface 34A to the area of the non-bonding surface.

In the present embodiment, the negative bus bar 29 has a larger cross sectional area of the current path and hence a lower electric resistance than the positive bus bar 34. Thus, the joule heat caused by the current flowing through the negative bus bar 29 is less than that by the current flowing through the positive bus bar 34, resulting in reduction of the difference between the temperatures which the heated positive and negative bus bars 34, 29 would reach.

Such reduction of the difference between the temperatures which the heated positive and negative bus bars 34, 29 would reach may be accomplished also by increasing the area of the part of the negative bus bar 29 bonded to the semiconductor devices 42, 44, 46, that is, the area of the bonding surface 29A so that the negative bus bar 29 is more cooled by the cooler 11. However, such increasing the area of the bonding surface 29A of the negative bus bar 29 requires a larger area of the surface where the negative bus bar 29 is bonded, namely, the top surfaces of the respective semiconductor devices 42, 44, 46, which leads to an increased size of the inverter 10 and hence is not a practical option.

The inverter 10 of the present embodiment offers the following advantages.

(1) The negative bus bar 29 has a larger ratio of the area of the bonding surface 29A to the area of the non-bonding surface than the positive bus bar 34. The negative bus bar 29 has a larger cross sectional area of the current path than the positive bus bar 34, so that the amount of heat or the joule heat generated at the negative bus bar 29 while the inverter 10 is being energized is less than that generated at the positive bus bar 34, thereby allowing reduction of the difference in the cooling between the positive bus bar 34 and the negative bus bar 29.

(2) The cooler 11 and the components mounted thereon are molded by the mold resin 12. When the metal plates 22 to 25 are heated and expanded while the inverter 10 is being energized, the mold resin 12 serves to restrict the thermal expansion of the metal plates 22 to 25, thereby preventing the metal plates 22 to 25 from being detached from the ceramic substrate 21.

(3) The base 30 of the negative bus bar 29 is disposed in overlapping relation to the positive bus bar 34 as seen in the direction of their thickness. The connecting members 26, 27, 28 are disposed in overlapping relation to the base 30 and the respective connecting portions 31, 32, 33 of the negative bus bar 29 as seen in the direction of their thickness. The direction of electric current flowing through the connecting members 26, 27, 28 and through the positive bus bar 34 is opposite to the direction of electric current flowing through the negative bus bar 29. Mutual induction occurring between the negative bus bar 29 and the respective connecting members 26, 27, 28 and between the negative bus bar 29 and the positive bus bar 34 results in reduced inductance of the inverter 10.

The above embodiment may be modified in various ways as exemplified below.

Figure 7:
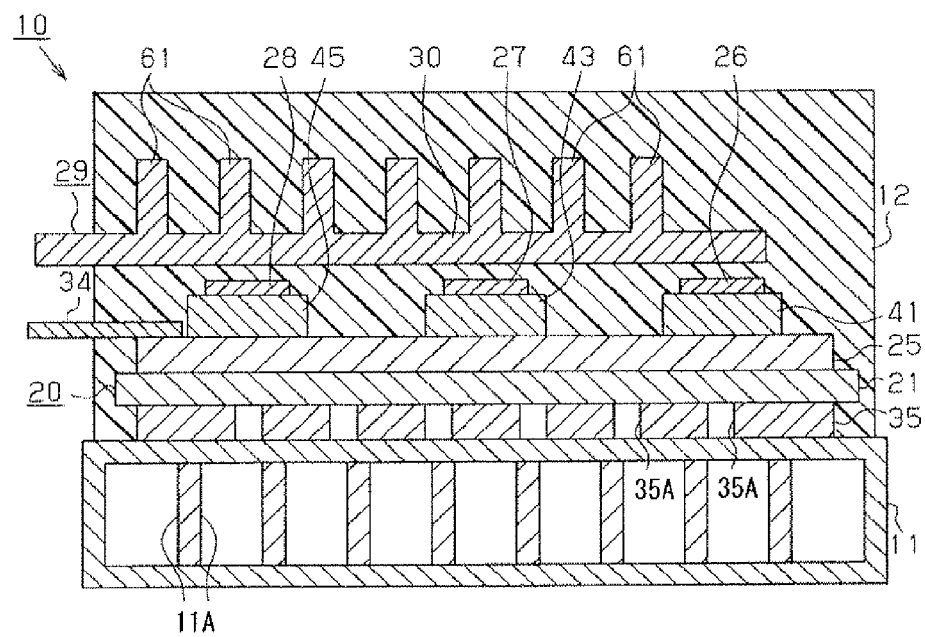
FIG. 7 is a sectional view of another embodiment of the three-phase inverter according to the present invention.

As shown in FIG. 7, plural fins 61 may be formed extending vertically from the top surface of the base 30 of the negative bus bar 29. The provision of such fins 61 increases the surface area of the negative bus bar 29, so that the negative bus bar 29 is more cooled than the positive bus bar 34, which further helps to reduce the difference in the cooling between the positive bus bar 34 and the negative bus bar 29

The negative bus bar 29 may be made of a material having an electrical conductivity that is higher than that of the positive bus bar 34 so that the negative bus bar 29 has a lower electric resistance than the positive bus bar 34. In this case, the negative bus bar 29 and the positive bus bar 34 may have substantially the same cross sectional area of the current path.

The cooler 11 and the components mounted thereon do not necessarily need to be molded by a mold resin such as 12.

If the positive bus bar 34 has a larger ratio of the area of the bonding surface to the area of the non-bonding surface than the negative bus bar 29, the positive bus bar 34 is made to have a lower electric resistance than the negative bus bar 29. In this case, the positive bus bar 34 corresponds to the second bus bar of the present invention, and the negative bus bar 29 corresponds to the first bus bar of the present invention.

The positive bus bar 34 may be bonded directly to the bottom surfaces of the semiconductor devices 41, 43, 45 without using the metal plate 25.

Additional conductive layers may be provided over the top surfaces of the semiconductor devices 42, 44, 46 and the negative bus bar 29 may be bonded to such additional conductive layers.

The present invention is applicable not only to a three-phase inverter such as 10, but also to a single-phase inverter or DC-DC converter.

What is claimed is:

1. A semiconductor unit, comprising:
an insulation layer;
a conductive layer bonded to one side of the insulation layer;
a semiconductor device mounted on the conductive layer;
a cooler thermally coupled to the other side of the insulation layer;
a first bus bar having a bonding surface bonded to the semiconductor device or the conductive layer and a non-bonding surface that is the part of the first bus bar other than the bonding surface; and
a second bus bar having a bonding surface bonded to the semiconductor device or the conductive layer and a non-bonding surface that is the part of the second bus bar other than the bonding surface, the second bus bar having a greater ratio of the area of the bonding surface to the area of the non-bonding surface than the first bus bar,
wherein the second bus bar has a lower electric resistance than the first bus bar.

2. The semiconductor unit of claim 1, wherein the second bus bar has a greater cross sectional area of current path than the first bus bar.

3. The semiconductor unit of claim 1, wherein the second bus bar is made of a material having an electrical conductivity that is higher than that of the first bus bar.

4. The semiconductor unit of claim 1, wherein the insulation layer, the conductive layer, the semiconductor device, the first bus bar, the second bus bar and the cooler are molded by a mold resin.

5. The semiconductor unit of claim 1, wherein the second bus bar has a fin.

6. A semiconductor unit, comprising:
an insulation layer;
a conductive layer bonded to one side of the insulation layer;
a semiconductor device mounted on the conductive layer;
a cooler thermally coupled to the other side of the insulation layer;
a first bus bar having a bonding surface bonded to the semiconductor device or the conductive layer and a non-bonding surface that is the part of the first bus bar other than the bonding surface; and
a second bus bar having a bonding surface bonded to the semiconductor device or the conductive layer and a non-bonding surface that is the part of the second bus bar other than the bonding surface, the second bus bar having a greater area of the non-bonding surface than the first bus bar,
wherein the second bus bar has a lower electric resistance than the first bus bar.

* * * * *